Figure 1:
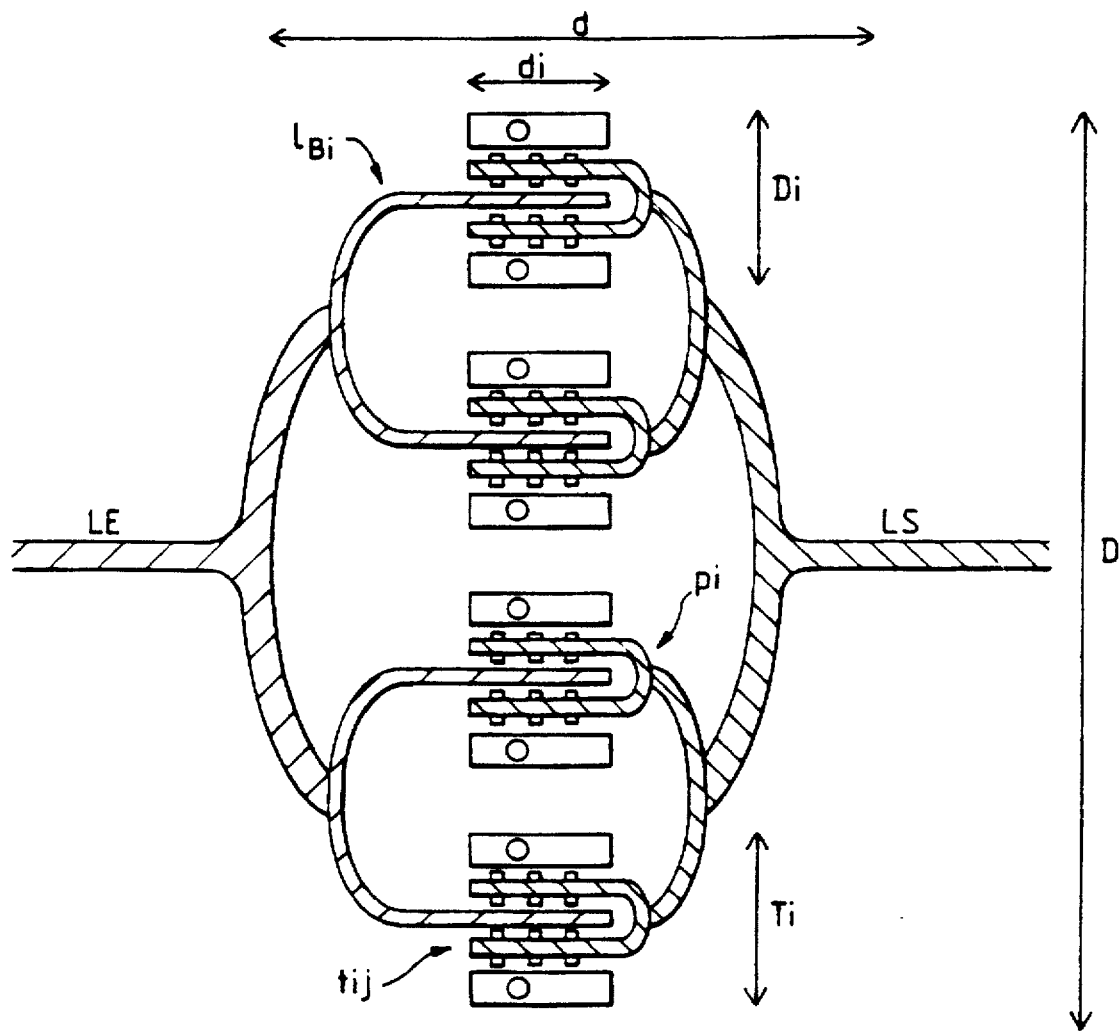

United States Patent [19]
Floriot et al.

[11] Patent Number: 5,689,212
[45] Date of Patent: Nov. 18, 1997

[54] LARGE-SCALE INTEGRATION MONOLITHIC MICROWAVE AMPLIFIER WITH TREE-LIKE DISTRIBUTED TOPOLOGY

[75] Inventors: Didier Floriot, Chatenay Malabry; Sylvain Delage, Bures S/Yvette; Pascal Roux, Vauhallan; Juan Obregon, St Priest Taurion, all of France

[73] Assignee: Thomson-CSF, Paris, France

[21] Appl. No.: 562,153

[22] Filed: Nov. 22, 1995

[30] Foreign Application Priority Data

Nov. 25, 1994 [FR] France .................... 94 14148

[51] Int. Cl.⁶ ................. H03F 3/60; H03F 3/68; H03F 3/195
[52] U.S. Cl. ................. 330/286; 330/295; 330/307
[58] Field of Search .............. 330/286, 292, 330/295, 307

[56] References Cited

U.S. PATENT DOCUMENTS

| | | | |
|---|---|---|---|
| 4,270,097 | 5/1981 | Le Tron et al. | 331/96 |
| 4,783,638 | 11/1988 | Mamodaly et al. | 331/99 |
| 5,194,403 | 3/1993 | Delage et al. | 437/184 |
| 5,252,841 | 10/1993 | Wen et al. | 257/197 |
| 5,411,632 | 5/1995 | Delage et al. | 156/652.1 |
| 5,469,108 | 11/1995 | Tserng | 330/286 |

OTHER PUBLICATIONS

K.B. Lasch and W.N. Schnaitter "26th Electronic Components Conference", *Advances in the Design of Microwave Power Transistors*, Apr. 26, 1976, San Francisco, CA, USA (pp. 131-139).

*Primary Examiner*—Steven Mottola
*Attorney, Agent, or Firm*—Oblon, Spivak, McClelland, Maier & Neustadt, P.C.

[57] ABSTRACT

Disclosed is a novel topology of monolithic, microwave amplifiers with high integration. This is a more compact topology, divided into a two-level or tree-like structure in which the division of the input signal is done firstly on each transistor $T_{ij}$ and, secondly, on each of the elementary transistors $t_{ijk}$ of the transistors $T_{ij}$. More specifically, the input line LE is divided into different basic lines $l_i$, each line $l_i$ supplying lines $l_{ij}$ distributed on either side of said lines $l_i$, a line $l_{ij}$ then supplying a power transistor $T_{ij}$. Application to microwave amplifiers.

4 Claims, 3 Drawing Sheets

LARGE-SCALE INTEGRATION MONOLITHIC MICROWAVE AMPLIFIER WITH TREE-LIKE DISTRIBUTED TOPOLOGY

BACKGROUND OF THE INVENTION

1. Field of the Invention

The field of the invention is that of high-powered monolithic integrated amplifiers, also known as monolithic microwave integrated chip (MMIC) amplifiers on semiconductor substrates and especially on GaAs.

2. Description of the Prior Art

In general, such amplifiers result from the combination of sets of parallel-connected elementary transistors which it is sought to integrate into limited surface areas. One of the topologies presently adopted is that shown in FIG. 1 which gives a schematic view of the different power transistors Ti with their elementary transistors tij parallel-connected on either side of a basic line $l_{Bi}$, comprising connections with the elementary bases of the elementary transistors. These different lines $l_{Bi}$ are connected to one another and to the main input line LE. The emitters of the elementary transistors are, for their part, connected to a common zone comprising via holes through the semiconductor substrate so as to connect the emitters to a ground plane located behind the substrate. The elementary collectors are connected to one another by collector bridges, pi connected mutually to an output line LS.

To obtain cumulative effects and achieve very high power values at output, it is imperative to divide the input signal as symmetrically as possible and then recombine it also in a very symmetrical manner. Indeed, if such a condition is not met, phase-shifting problems adversely affect the summation of the elementary amplifiers at each transistor Ti. It can be seen however that this type of topology, as shown schematically in FIG. 1, has two types of drawbacks:

firstly, the difficulty of integrating a large number of elementary transistors on a given surface area owing to the size D proportional to the number of parallel-connected power transistors;

secondly, the increase in losses in the impedance-matching circuits located between the input and the transistors as well as between these transistors and the output. These losses are all the greater as they pertain to transistors located far from the input and output lines LE and LS.

Figure 2B:
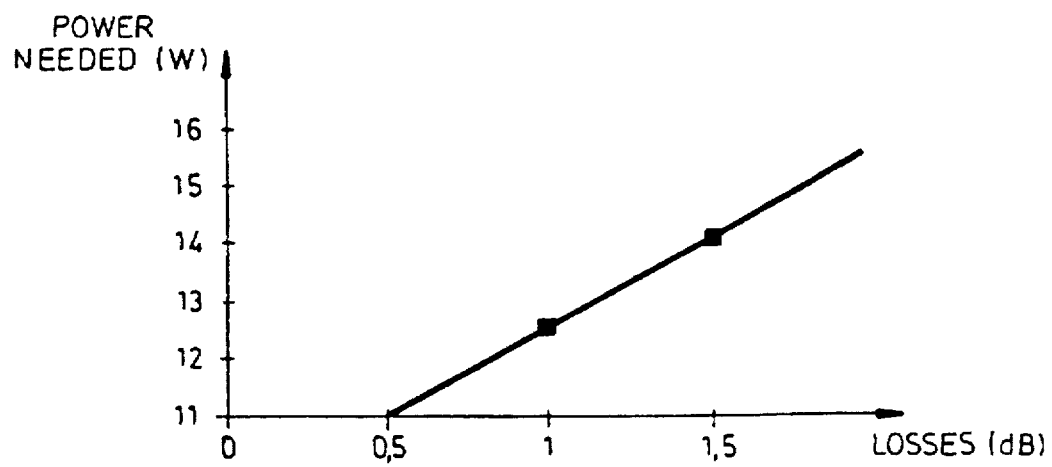
Figure 2A:
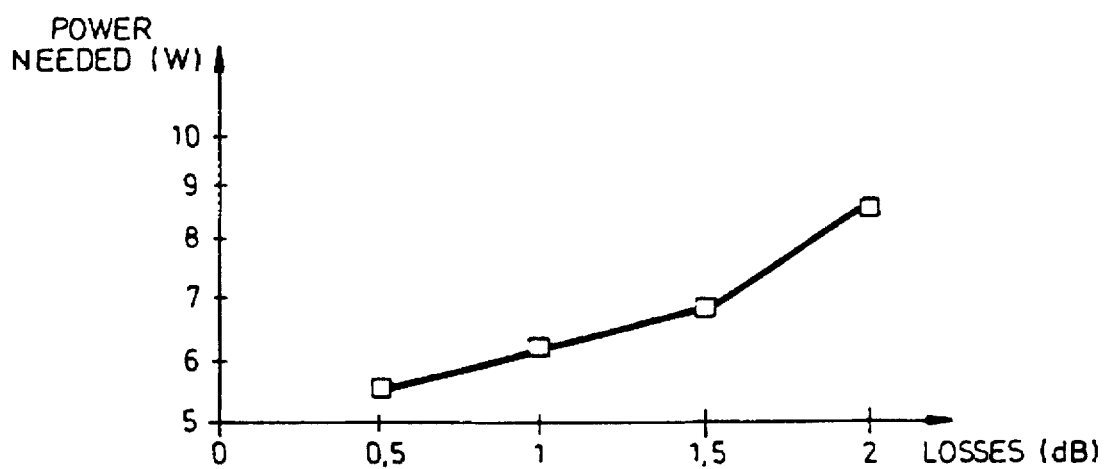

As an indication FIG. 2 gives, for output power values of 5 W (FIG. 2a) and 10 W (FIG. 2b) respectively, the necessary power values that have to be provided by the set of transistors in view of the losses in the output network. Thus, losses of 2 dB cause a loss of 30% of power in the matching network whence a severe problem of heat dissipation on the concerned part of the substrate.

Typically, in monolithic technology on GaAs, the losses range from 0.5 to 1.5 dB and therefore cause a substantial drop in the power recorded in the line LS.

In order to reduce the size D of the power amplifier shown in FIG. 1 and limit the on-line losses of power amplifiers, the invention proposes a more compact component with an original topology enabling the integration of a large number of power transistors in a limited amount of space and making it possible to avoid great line lengths.

In the proposed topology, the critical dimension Di of a power transistor Ti is rotated by 90° with respect to the prior art configuration shown in FIG. 1. This dimension $D_i$ thus becomes parallel to the input/output axis of the microwave component.

To implement this rotation, the topology used in the invention may be compared with a two-level or tree-like divided structure, for the division of the input signal is done:

on each power transistor Tij, on each of the elementary transistors tijk of the transistors Tij.

SUMMARY OF THE INVENTION

More specifically, an object of the invention is a power semiconductor component supplied by an input line LE and comprising n power transistors Tij, each transistor Tij comprising mij elementary transistors tij, parallel-connected on each side of a basic input line lij, wherein the line LE is divided into parallel lines li, on either side of which there are distributed the lines lij that supply the transistors Tij.

To further increase the compactness of the entire unit, each power transistor Tij may share an emitter Eij with its closest neighbor or neighbors, this emitter Eij providing a link between the emitters eijk of the transistor tijk of one and the same transistor Tij.

The topology according to the invention may advantageously have impedance matching circuits between the propagation lines and the inputs or outputs of the power transistors, these impedance matching circuits enabling compensation for the phase shift created during the distribution of the basic current from the line li in the different basic lines lij.

Preferably, these impedance matching circuits between each transistor Tij are introduced into the free spaces, connected between the emitters and the lines li. This in no way leads to a decrease in the compactness of the tree-like topology proposed by the invention.

BRIEF DESCRIPTION OF THE INVENTION

Figure 3:
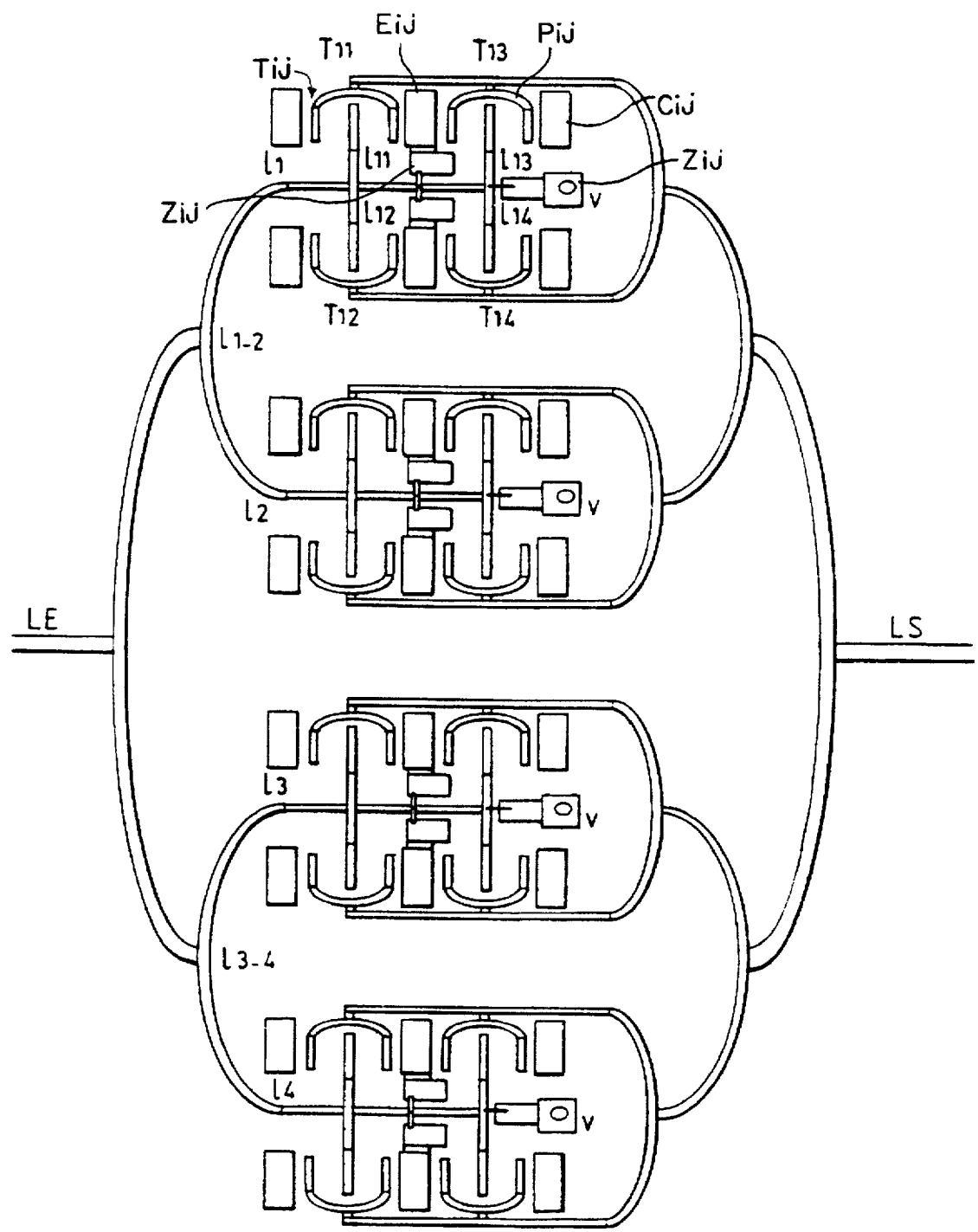

The invention will be understood more clearly and other advantages shall appear from the following description, given by way of a non-restrictive example, and from the appended figures, of which:

FIG. 1 gives a schematic view of a power amplifier configuration according to the prior art;

FIG. 2 illustrates the power values to be given by the set of power transistors to obtain 5 W (curve 2a) and 10 W (curve 2b) respectively as a function of the losses on the output matching circuit;

FIG. 3 gives a schematic view of a topology of a power component according to the invention.

MORE DETAILED DESCRIPTION

The invention proposes a novel topology of a power semiconductor component that can be applied in particular to (MMIC) amplifiers. These are prepared by integration on a substrate which may advantageously be of the GaAs type.

Thus, on a given substrate, it is possible to define a power cell comprising a set of elementary transistors, tijk, for which it is sought to add up the power gains. For this purpose, the topology adopted is that shown schematically in FIG. 3 in which only a limited number of transistors tijk has been shown. These elementary transistors may be bipolar heterojunction transistors which perform exceptionally well for power applications.

The different transistors tijk are distributed among several power transistors Tij around basic lines lij that supply said transistors Tij distributed on either side of the lines li. The basic lines are connected to one another in twos. FIG. 3, in this respect, illustrates the connection, for example, the lines $l_1$ and $l_2$ in a common line $l_{1-2}$. A division of the input signals such as this furthers the phasing of the different power transistors.

With this type of topology, it is also possible to prepare N order horizontal integration cells (N transistors Tij along one line) and M order vertical integration cells (2M transistors Tij along the vertical axis Y, since transistors Tij are distributed along the lines li on either side).

However, even if there is a horizontal symmetry, there is no vertical symmetry. The basic currents flowing in a line lij and in a neighboring line lij+2 are not in phase.

To compensate for these phase shifts, matching circuits (LC) Zij are introduced into the different lines li. These circuits Zij are formed by lengths and widths of matched lines as well as by capacitors with a designed capacitance. More specifically, the capacitors are formed by a dielectric layer between two metal electrodes. The upper electrode is connected to the basic line and the lower electrode is connected to the emitter zone which has a via hole providing for the ground connection.

At each transistor Ti, it is possible if desired to set up a parallel connection of the transistors having different power characteristics, namely a variable number of elementary transistors.

A configuration such as this: the parallel connection of a set of power transistors along a vertical axis and a distribution of power transistors along a basic line li makes it possible to combine the power performance characteristics of the amplifiers in which the transistors are parallel-connected with the bandwidth obtained with a distributed amplifier configuration.

Table I below thus illustrates the performance characteristics that may be obtained in the above-mentioned three configurations:

|  | Parallel-connected Amplifier | Distributed Amplifier | Amplifier of the invention |
|---|---|---|---|
| Passband octaves | <1 octave | >2.5 octaves | <2 |
| Power | 1W–10W | <0.5W | 1W–10W |

One octave corresponds to the frequency range (fo–2 fo):

To compare the compactness of a topology according to the invention with a conventional configuration of parallel-connected transistors, Table II indicates the dimensions Dx and Dy that are necessary respectively along the axes X and Y given in FIG. 1 in order to obtain power values respectively of 2.5 W, 5 W and 10 W.

| Conventional structure | 2.5W | 5W | 10W |
|---|---|---|---|
| Dx (mm) | 2.23 | 2.74 | 3.73 |
| Dy (mm) | 2.04 | 4.47 | 8.96 |
| Surface area (mm$^2$) | 4.55 | 12.2 | 33.42 |

-continued

| Structure of the invention | | | |
|---|---|---|---|
| Dx (mm) | 2.37 | 3.02 | 3.57 |
| Dy (mm) | 1.34 | 2.23 | 4.01 |
| Surface area (mm$^2$) | 3.18 | 6.73 | 14.32 |

What is claimed is:

1. A power semiconductor component comprising:
at least one input line extending in a longitudinal direction and having first and second sides;
a first plurality of at least four elementary transistors having inputs coupled to the first side of the at least one input line at specific locations along the longitudinal direction of the at least one input line, said first plurality of at least four elementary transistors forming at least two adjacent power transistors each including an adjacent two of the at least four elementary transistors having output collectors connected together to form an output for each of the at least two adjacent power transistors;
a second plurality of at least four elementary transistors having inputs connected to the second side of the at least one input line at said specific locations, said second plurality of at least four elementary transistors forming at least two further adjacent power transistors each including an adjacent two of the at least four additional elementary transistors having output collectors connected together to form an output for each of the at least two further adjacent power transistors;
the first and second pluralities of at least four elementary transistors each further including at least two adjacent elementary transistors not cooperating to form a power transistor but sharing an emitter electrode;
a first set of a pair of compensating impedance matching networks placed in a free space on each side of the at least one input line between the shared emitter electrode and each side of the at least one input line; and
at least one further compensating impedance matching circuit placed in a free space formed between an emitter electrode of each of the last of the four elementary transistors of the first and second pluralities of elementary transistors and a termination of the at least one input line.

2. The power semiconductor component of claim 1, wherein all transistors are formed on a GaAs substrate.

3. The power semiconductor component of claim 1, wherein there are at least two said input lines connected to a main input line.

4. The power semiconductor component of claim 1, wherein there are at least four said input lines connected to a main input line.

* * * * *